United States Patent

Gudesen et al.

[11] Patent Number: 6,052,354
[45] Date of Patent: Apr. 18, 2000

[54] OPTICAL DATA STORAGE MEDIUM AND METHOD FOR WRITING AND READING OF DATA

[75] Inventors: Hans Gude Gudesen, Gamle Fredrikstad; Per-Erik Nordal, Nesbru; Rolv Møll Nilsen, Moss; Thormod Næringsrud, Slitu, all of Norway

[73] Assignee: Thin Film Electronics ASA, Oslo, Norway

[21] Appl. No.: 08/981,425

[22] PCT Filed: Jun. 24, 1996

[86] PCT No.: PCT/NO96/00155

§ 371 Date: Dec. 23, 1997

§ 102(e) Date: Dec. 23, 1997

[87] PCT Pub. No.: WO97/01171

PCT Pub. Date: Jan. 9, 1997

[30] Foreign Application Priority Data

Jun. 23, 1995 [NO] Norway ................................... 952542

[51] Int. Cl.⁷ ..................................................... G11B 7/00
[52] U.S. Cl. ........................................... 369/112; 369/100
[58] Field of Search .................................... 369/103, 109, 369/112, 94, 44.37, 100; 365/106, 127, 125, 215, 216, 234, 120; 359/15, 27, 32

[56] References Cited

U.S. PATENT DOCUMENTS

| | | | |
|---|---|---|---|
| 3,191,157 | 6/1965 | Parker et al. | 340/173 |
| 3,440,620 | 4/1969 | French | 340/173 |
| 3,573,433 | 4/1971 | Harris | 235/61.11 |
| 3,637,307 | 1/1972 | Spitz | 355/40 |
| 3,656,120 | 4/1972 | Maure | 340/173 |
| 3,676,864 | 7/1972 | Maure et al. | 340/173 |
| 3,704,068 | 11/1972 | Waly | 355/46 |
| 3,765,749 | 10/1973 | LaMacchia | 350/161 |
| 3,806,643 | 4/1974 | Russell | 178/6.7 |
| 3,860,917 | 1/1975 | Auria | 340/173 |
| 3,885,094 | 5/1975 | Russell | 178/7.6 |
| 3,898,005 | 8/1975 | Roberts | 355/54 |
| 3,899,778 | 8/1975 | Roberts | 340/173 |
| 3,952,290 | 4/1976 | Williams . | |
| 3,996,570 | 12/1976 | Roberts | 340/173 |
| 4,021,606 | 5/1977 | Takeda et al. | 358/130 |
| 4,227,212 | 10/1980 | Woolfson et al. | 358/126 |
| 4,588,261 | 5/1986 | Erhardt | 350/167 |
| 4,633,445 | 12/1986 | Sprague . | |
| 4,663,738 | 5/1987 | Sprague et al. | 365/127 |
| 4,682,861 | 7/1987 | Hosoya | 350/432 |
| 4,727,533 | 2/1988 | Erbert | 369/112 |

(List continued on next page.)

FOREIGN PATENT DOCUMENTS

| | | |
|---|---|---|
| 501 106 | 11/1994 | Sweden . |
| 91/11804 | 8/1991 | WIPO . |
| 93/13529 | 7/1993 | WIPO . |
| 95/16994 | 6/1995 | WIPO . |

*Primary Examiner*—Thang V. Tran
*Attorney, Agent, or Firm*—Jacobson, Price, Holman & Stern, PLLC

[57] ABSTRACT

In an optical data storage medium with a storage area formed from a transparent, homogenous base material and with a number of optically active structures at one side of the storage area, the optically active structures are diffractive optical elements which can focus a beam of light incident on the storage area on to one or more points in the storage area and/or a redirected beam of light or emitted light radiation from this or these points on to a point outside the optical storage medium. During writing/reading of data in the storage medium, the diffractive optical elements are used for focusing the write/read beam in order to generate a data carrying structure or read data stored in such a data carrying structure, respectively. By exploiting the special optical properties of diffractive optical elements, it is possible to achieve parallel writing/reading of data, possibly in several parallel storage layers in the optical storage medium or randomly distributed therein, the optical storage medium thus providing a genuine volumetric storage and a corresponding genuine volumetric accessing of the stored data.

26 Claims, 9 Drawing Sheets

U.S. PATENT DOCUMENTS

| | | | |
|---|---|---|---|
| 4,743,091 | 5/1988 | Gelbart | 350/252 |
| 4,745,417 | 5/1988 | Inokuchi | 346/108 |
| 4,794,245 | 12/1988 | Auer | 250/203 |
| 4,899,224 | 2/1990 | Ooba et al. | 358/332 |
| 4,988,153 | 1/1991 | Paek | 350/3.8 |
| 5,007,690 | 4/1991 | Chern et al. | 350/3.68 |
| 5,013,107 | 5/1991 | Biles | 350/3.7 |
| 5,138,604 | 8/1992 | Umeda et al. | 369/103 |
| 5,340,978 | 8/1994 | Rostoker | 250/208.1 |
| 5,379,266 | 1/1995 | Russell | 365/234 |
| 5,436,871 | 7/1995 | Russell . | |
| 5,541,888 | 7/1996 | Russell | 365/234 |
| 5,657,304 | 8/1997 | Lehureau | 369/109 |
| 5,696,714 | 12/1997 | Russell | 365/106 |

OPTICAL DATA STORAGE MEDIUM AND METHOD FOR WRITING AND READING OF DATA

The invention concerns an optical data storage medium comprising a data storage area formed by a substantially transparent homogeneous base material and with a number of optically active structures in the form of diffractive optical elements adjacent to one side of the data storage area, wherein the diffractive optical elements each are adapted to focus a light beam incident on the data storage area onto one or more points which each corresponds to a uniquely addressable location of a data-carrying structure which is to be generated or a generated data-carrying structure in the data storage area and/or to focus a redirected light beam or emitted light radiation from this point or these points onto a point outside the optical storage medium. The invention also concerns methods for writing of data according to the introduction to claims 13 and 14 together with methods for reading of data according to the introduction to claims 17 and 18 respectively. Furthermore the invention also concerns a method for parallel writing of data according to the introduction to claim 20 and a method for parallel reading of data according to the introduction to claim 21.

The present invention is intended to be used in optical data storage media in the form of rotating discs, rectangular cards or sheets or tapes in the form of strips or spools.

The present invention is especially intended to be employed in connection with a data carrying medium and a method for generating a data carrying structure in such a data carrying medium, as described in International Published Application WO96/37888, titled "Optical data storage" assigned to present applicant and to which reference will be made here.

In digital optical data storage according to the state of the art a sharply focused laser beam is systematically scanned over the surface of the data carrying medium, typically a rotating disc, and the data content is deduced by recording changes in reflected light from the disc when the laser beam passes microscopic pits or spots which have been encoded on to the medium. High data densities can be achieved when the pits or the spots are small and are located close together. The pits or spots which form the data carrying structures can either be moulded or pressed into the disc at the time of manufacture, or a scanning laser beam may be used to encode data into the disc by means of short, intense bursts of light which cause the data carrying structures to be formed, e.g. in the form of pits.

FIELD OF THE INVENTION

This method of optical data storage and accessing has a number of drawbacks. A highly precise optomechanical system is required in order to position the laser beam accurately along the track containing the data, and the data are read out serially. This entails mechanically operative restrictions and also reduces random access speed. The latter problem is particularly serious in many applications, and comprehensive research is currently in progress with a view to the development of lighter optical head designs which permit faster mechanical positioning. Mechanically based methods, however, are not suited to the attainment of very high access rates and considerable resources have therefore beer invested on research in order to develop addressing schemes for light beams based on acoustooptic or elctrooptic effects. Since such schemes now could be implemented in compact and preferably low-cost physical packages, integrated optical structures have been of particular interest to researchers.

Even though the above mentioned ongoing research will eventually result in practical hardware, due to sequential access to the stored information and as a result of the tracking method employed, the data transfer rates will be a serious problem. In order to eliminate his, research has been carried out on multi-track solutions where data are transferred in parallel by optical heads which write and read a number of adjacent tracks. Only a few neighbouring tracks can be covered in this fashion by a single servo-controlled optical head, and several independently tracking heads are required in order to achieve higher speed. The degree of write and read parallelism achievable by such methods is severely limited by physical and cost restraints.

BACKGROUND OF THE INVENTION

An example of an optical memory which avoids the problems with mechanically based addressing methods is disclosed in International Published Application WO93/13529. Data are stored in an optical layer 19 which is capable of selectively altering light by e.g. a change in transmissivity, reflectivity, polarization and/or phase. The data layer 19 is illuminated by controllable light sources 15 and an array 21 of imaging lenslets project the image onto a common array 27 of light sensors. By selectively and sequentially illuminating different data regions or pages in the data layer, correspondingly different data patterns are imaged by corresponding lenslets 21 onto the common sensor array 27.thereby enabling the retrieval of a great number of data pages by multiplexing electrooptically. In a preferred embodiment the lenslets 21 may be replaced by diffractive optical structures 402, 406, although it is acknowledged that unless monochromatic or narrow band light sources are used, diffractive optical structures give rise to undesirable aberrations or distortions in the image data due to different source wave lengths. Moreover, this optical memory also structurally separates the read and write optics, leading to a rather complicated optical arrangement involving the provision of a beam splitter 31 in the housing 11 of the memory.

As an example of a data storage medium suitable for an optical memory reference may be made to e.g. U.S. Pat. No. 5,436,871 (Russell), which derives from the parent application of WO93/13529 and discloses a compact optical memory wherein data is stored on a card 104 with integrated lenslet arrays 210 and in an optical data 190 layer capable of selectively altering light by a change in transmissivity, reflectivity, polarization and/or phase. Optical memories may, however, also be implemented with a storage medium capable of emitting fluorescent light upon excitation with a suitable light source, as for instance disclosed in the above-mentioned International Published Application WO96/37888, or containing a chromophore compound, as for instance disclosed in International Published Application WO96/21228 which teaches the use of bacteriorhodopsin as the chromophore.

SUMMARY OF THE INVENTION

The object of the present invention is to avoid the above-mentioned problems associated with current technology for optical data storage as well as the problems resulting from a number of previously proposed solutions. A further object is to be able to access large blocks of data in a data carrying medium in parallel and replace mechanical movement completely or partially by employing electronically based addressing and electronically based logic operations.

A particular object of the present invention is to achieve simple writing and reading of optically stored data in a large number, i.e. several hundreds to several thousands, of parallel channels and to obtain rapid random access of the data, in some cases with no mechanical motion involved.

It is a further object of the invention to be able to provide an inexpensive data carrying medium with high data density. Yet another object of the invention is that in a number of applications a laser source is not needed, but incoherent photo-emitters such as light emitting diodes (LEDs) will do. Another object of the invention is that it should be able to match with any format whatever on the data carrying medium, whether be it discs, cards or tapes, besides permitting the use of very compact optical write/read hardware. The above-mentioned objects are achieved according to the invention with an optical data storage medium characterized in that the diffractive optical elements are formed with controlled, stepwise phase changes; together with a method for writing of data characterized by forming the diffractive optical elements with controlled, stepwise phase changes, directing a laser beam onto a diffractive optical element on the optical storage medium, thus focusing said laser beam by said diffractive optical element onto a specific point in the data storage area, whereby the energy given off from said laser beam in the focal point in an as per se known manner effects a physical or chemical change in the material in a virgin data storage area at this point, and thereby generating a data carrying structure which is assigned a datum whose value corresponds to the degree of physical or chemical change in the material in said data carrying structure, said degree being determined by modulating said laser beam according to a predetermined modulation procedure, another method for writing of data characterized by forming the diffractive optical elements with controlled, stepwise phase changes, directing a laser beam onto a diffractive optical element on the optical storage medium, tuning said laser beam's wavelength such that said laser beam is focused by said diffractive optical element onto a specific point in the data storage area, and whereby the energy given off said laser beam in the focal point in an as per se known manner effects a physical or chemical change in the material in a virgin data storage area at this point, and thereby generating a data carrying structure which is assigned a datum whose value corresponds to the degree of physical or chemical change in the material in said data carrying structure, said degree being determined by modulating said laser beam according to a predetermined modulation procedure, a method for reading of data characterized by forming the diffractive optical elements with controlled, stepwise phase changes, directing a light beam onto a diffractive optical element on the optical data storage medium, thus focusing said light beam onto a specific data carrying structure in the data storage area, whereby the energy given off from said light beam in the focal point in an as per se known manner effects an optically detectable response from said data carrying structure, such that said detectable response corresponds to the value of the datum stored in said data carrying structure, and focusing said optically detectable response by said diffractive optical element onto an optical detector provided outside said optical storage medium, another method for reading of data characterized by forming the diffractive optical elements with controlled, stepwise phase changes, directing a light beam onto a diffractive optical element on the optical data storage medium; tuning said light beam's wavelength such that said light beam is focused onto a specific data carrying structure in the data storage area, whereby the energy given off from said light beam in the focal point in an as per se known manner effects an optically detectable response from said data carrying structure, such that said detectable response corresponds to the value of the datum stored in said data carrying structure, and focusing said optically detectable response through said diffractive optical element on to an optical detector provided outside said optical storage medium; as well as a method for parallel writing of data characterized by forming the diffractive optical elements with controlled, stepwise phase changes, directing two or more laser beams emitted by a laser device which comprises two or more separately activatable laser elements, through an optical device and with different angles of incidence onto a diffractive optical element on the optical storage medium, tuning each individual laser beam's wavelength such that said laser beam is focused by said diffractive optical element onto the same plane, said plane corresponding to a specific storage layer in the data storage area, whereby the energy given off from each laser beam in the focal point in an as per se known manner effects a physical or chemical change in the material in a virgin storage layer in each focal point in said plane, thereby generating a number of data carrying structures in said plane corresponding to the number of laser beams, and assigning to each data carrying structure a datum whose value corresponds to the degree of physical and chemical change in said data carrying structure, said degree being determined by modulating said respective laser beam according to a predetermined modulation procedure; and a method for parallel reading of data characterized by forming the diffractive optical elements with controlled stepwise phase changes, directing two or more light beams from an illumination device which comprises two or more selectively activatable light sources with fixed or tunable wavelengths, said light beams' wavelengths either being fixed or tuned by means of an optical device, onto one or more diffractive optical elements on the data storage medium, thus focusing said light beams onto specific data carrying structures in the data storage area, whereby the energy given off from each light beam in the respective focal point in an as per se known manner effects optically detectable responses from said data carrying structures, and focusing said optically detectable responses through a further optical device on the opposite side of said data storage medium and onto optical detector elements in an optical detector device, the detected optical responses corresponding to the values of the data assigned to said respective data carrying structures.

In a preferred embodiment of the optical data storage medium the diffractive optical elements according to the invention are zone plate lenses. In another perferred embodiment of the optical data storage medium the data storage medium is designed in the form of a tape, a disk or a card, and the diffractive optical elements are arranged on the surface of said tape, disk or card.

In another preferred embodiment of the optical data storage medium the data storage area comprises one or more storage layers which form one or more distinct storage planes, and that the storage layer comprises fluorescent dye molecules embedded in the base material which forms the storage layer, the dye molecules in each individual storage layer having a distinct spectral response matching the wavelength of the light beam focused onto this storage layer by the diffractive optical element DOE.

BRIEF DESCRIPTION OF THE DRAWINGS

The invention will now be explained in more detail in connection with an account of the principle of diffractive optical elements as used in the present invention and in connection with embodiments, with reference to the accompanying drawing.

FIG. 3b,c,d illustrates different methods for approximating or quantizing the phase function of the profile in FIG. 3a.

DETAILED DESCRIPTION OF THE PREFERRED EMBODIMENTS

A fundamental feature of the present invention is the use of optically active structures in the form of diffractive optical elements DOEs in the data carrying medium, the diffractive optical elements DOEs acting as a multitude of microscopic lenses. The actual data carrying medium according to the present invention thereby becomes in effect an integral part of the optical systems which shape and guide the light which is used for writing and read-out of data. Furthermore, according to the invention it is required that the diffractive optical elements are formed with controlled, stepwise phase changes. Thus a number of the restrictions which are encountered in traditional optical data storage methods are eliminated, and the possibility is opened up of achieving high write/read performance with practical and inexpensive hardware.

Diffractive optics are based on diffraction, as opposed to refraction or reflection of light. In many instances DOEs can take the place of conventional refractive optics such as lenses or prisms, thus providing a substantial reduction in cost or size. In a number of cases diffractive optics may provide better performance than refractive elements, e.g. achromatization, or even provide opportunities beyond the reach of conventional optical elements based on refraction or reflection.

Figure 1:
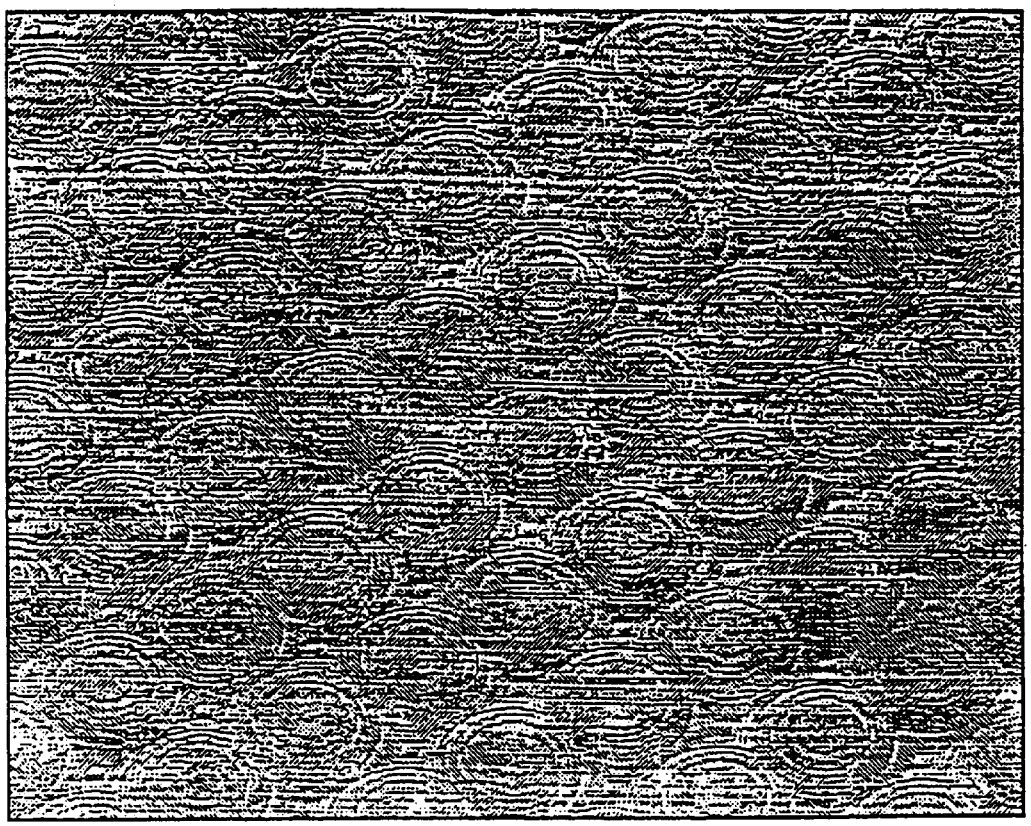
FIG. 1 illustrates optically active structures in the form of a matrix of diffractive optical elements DOEs.

FIG. 1 illustrates a matrix of diffractive optical elements DOEs. Each DOE consists of carefully designed topographic structures which can be manufactured and reproduced by a wide range of processes such as moulding, embossing, dry or wet etching.

A description will now be given of how diffractive optical elements DOEs are used in the optical data storage medium according to the invention in order to achieve the desired data storage capacity. The data storage capacity will be dependent on the maximum density which can be obtained by non-overlapping focused areas or focal spots in the data carrying medium's substrate behind the DOE. Particularly the following description shall focus on the use of zone plate lenses as a particularly preferred embodiment of DOEs with controlled, stepwise phase changes.

Figure 2A:
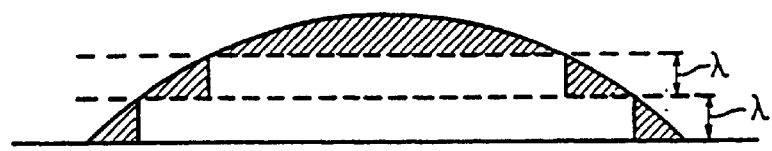
FIG. 2a,b illustrates the principle of a diffractive optical element DOE or a zone-plate lens as used in the present invention.
Figure 2B:

The design principle for a diffractive optical element DOE or a zone-plate lens is illustrated in FIG. 2. If it is assumed for the sake of simplicity that a plane wave with the wavefront parallel to the planar surface of the lens illustrated in FIG. 2a is incident from below, only the hatched areas in FIG. 1a will influence the transmitted wavefront, apart from a phase factor of $2n\pi$, where $n\pi$ is an integer. Consequently the lens illustrated in FIG. 2b will produce the same transmitted wavefront as the lens in FIG. 2a, apart from the fact that there is a discontinuous phase jump of $2n$ between two different zones in the lens in FIG. 2b. A lens such as that illustrated in FIG. 2b is described as a diffractive optical element DOE or a zone-plate lens. It is distinguished from a Fresnel lens in that the latter has a random phase jump from one zone to another due to inaccuracies in the manufacturing process, with the result that the wave fields which arise from the different zones do not provide a constructive interference in the focal area. Consequently the diffraction-limited resolution of the Fresnel lens is determined by the width of the zone, while the resolution of a zone-plate lens is determined by the diameter of the lens.

Figure 3A:
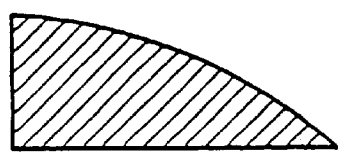
FIG. 3a illustrates the profile of a zone in the diffractive optical element DOE in FIG. 2b.
Figure 3C:
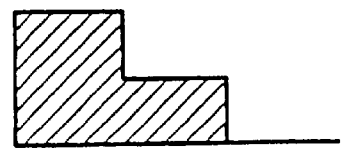
Figure 3B:
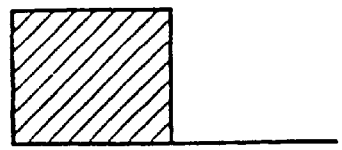
Figure 3D:
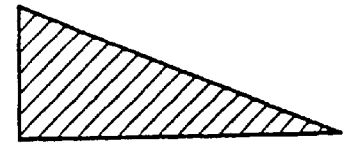

The actual profile of one of the zones in FIG. 2b is illustrated in FIG. 3a. In practice, however, it can be easier to use graduated zone profiles, as illustrated in FIG. 3b and 3c. The number of steps in the graduated profile is described as the number of quantizing levels for the phase function. It is evident that when the number of quantizing levels becomes infinitely large, a continuous profile can be obtained like that in FIG. 3d. The principle for the design of a zone-plate lens which will provide an optimum image of a point on the axis is that the optical path length from the object point to the image point via each zone in the lens should be the same as the direct optical path length between the object and the image point, apart from an integer number of wavelengths.

Figure 4A:
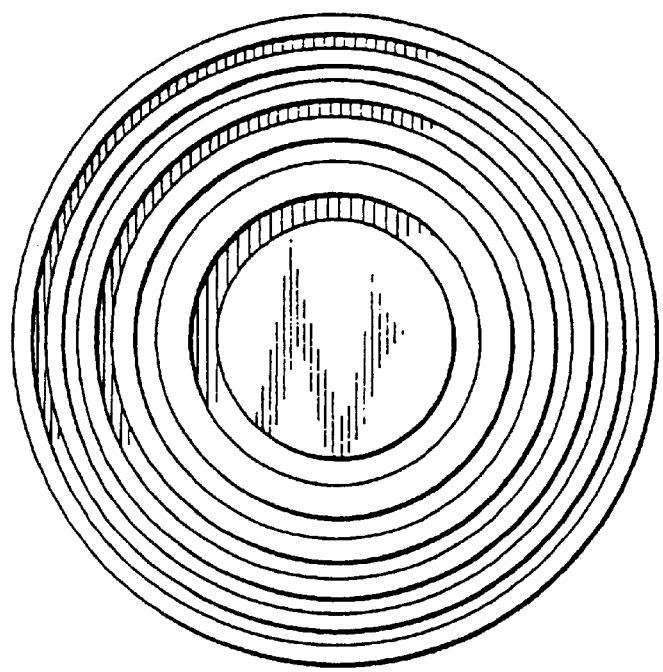
FIG. 4a,b illustrates zone-plate lenses considered as a diffraction grating.
Figure 4B:
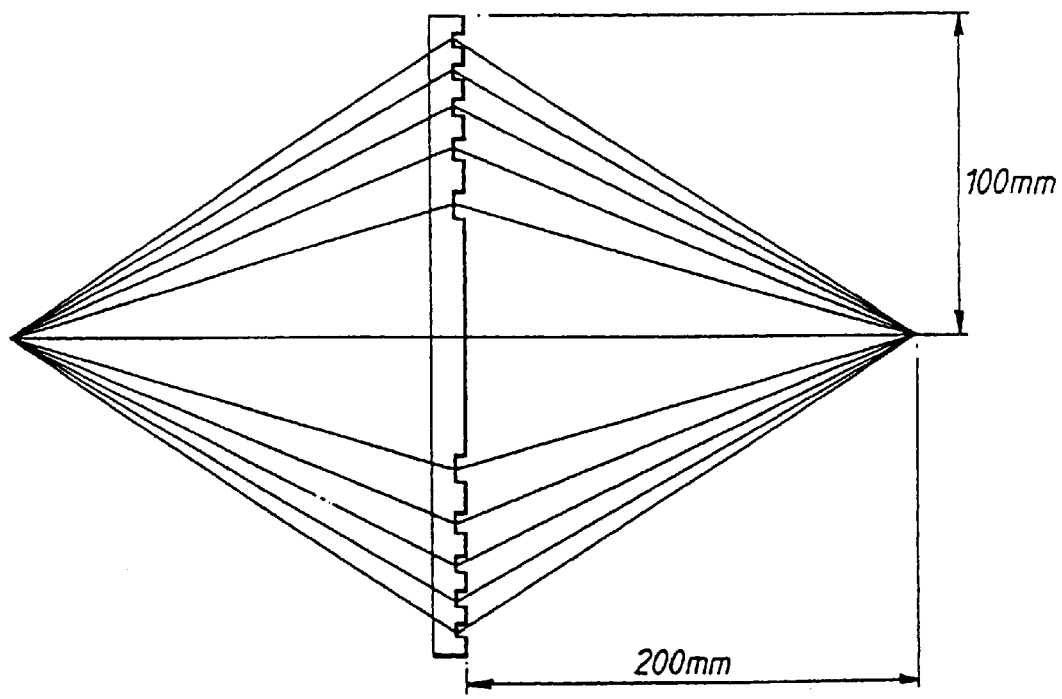

A DOE or zone-plate lens is illustrated in a top view in FIG. 4a and a sectional elevation in FIG. 4b respectively. It will be seen that the zone-plate lens consists of a number of concentric, annular openings, each ring being assigned a specific phase and amplitude value. Moreover it is well known that zone-plate lenses have focal points of a higher order, with the result that only a portion of the incident energy ends up in the desired image. It is also well known that the efficiency of zone-plate lenses can be increased by increasing the number of quantizing levels for the phase function. It has been shown that it is possible to obtain intensity levels of 33, 57 and 67% in the main lobe of the aberration-free image for 2, 3 and 4 quantizing levels respectively. Recently, however, a new encoding method called the RSIDO method has been developed, which is said to give a measured diffraction efficiency of 90%. Otherwise a disadvantage with the zone-plate lens is that it has major chromatic aberrations. However, as long as the illumination is relatively monochromatic, a moderate alteration in the illumination wavelength in relation to the wavelength used in the construction of the zone-plate lens will not lead to a substantial deterioration in the quality of the image. In general the field of vision is also restricted by coma, astigmatism and field curvature, but coma can be avoided by placing the zone-plate lens or DOE on a spherical surface.

The ray path in a zone-plate lens or DOE can be found by considering it as a diffraction grating with a different grating period and by constructing geometrical beams on the basis of the grating equation. With reference to the schematically illustrated zone-plate lens in FIG. 4a, b, it can be considered as illustrated in FIG. 4a as a circular diffraction grating with a period which decreases towards the edge of the lens. In the zone-plate lens illustrated in FIG. 4b the field is connected to an incident geometrical beam, locally a plane wave. The direction of the transferred geometrical beam corresponding to first order diffraction is given by the grating equation $$\sin\theta_t - \sin\theta_i = \frac{\lambda}{d} \quad (1)$$

where $\lambda$ is the wavelength, d the local value for the grating period and $\theta_i$ and $\theta_t$ are the angles between the normal geometrical beam on the grating and the incident and transmitted geometrical beam respectively. Since d decreases towards the edge of the lens, it can be seen in FIG. 4b that the outermost beams receive a greater deflection than the beams near the centre. By causing the grating period to decrease in a specific manner, all the beams can be directed towards a common focal point. It should be noted that different scales are employed along the horizontal and vertical axes respectively in FIG. 4b.

Figure 5:
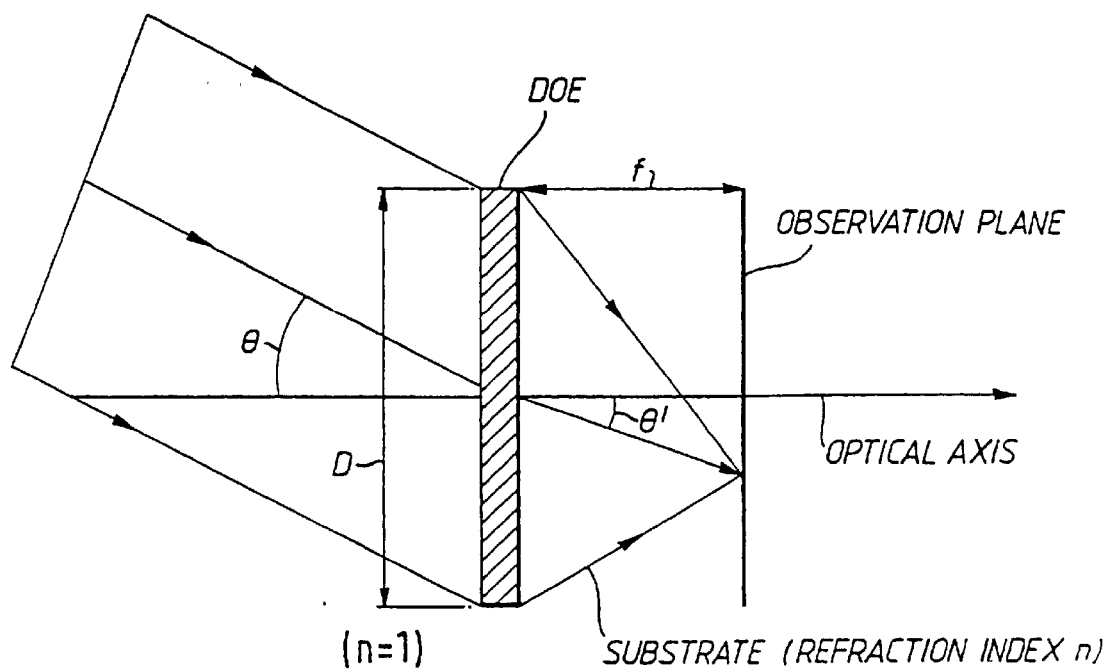
FIG. 5 illustrates how an incident plane wave is focused by a diffractive optical element in a substrate.

The geometry of the ray path in a DOE is illustrated schematically in FIG. 5. A monochromatic plane wave with a given wavelength $\lambda 0$ in air has an angle of incidence $\theta$ to the optical axis for a DOE which is provided in contact with a planar substrate with the refraction index. The diameter of DOE is indicated by D and the secondary focal length for the combination DOE/substrate is indicated by f. For different combinations of the f/number, diameters D for the DOE and refraction indices n for the substrate, the full width of the focal spot at half maximum intensity (FWHM) could be determined as follows. It was found that FWHM varied between 0.33 $\mu$m and 0.42 $\mu$m on the optical axis and between 0.70 $\mu$m and 0.90 $\mu$m at the edge of the field of vision. The transmitted intensity on the optical axis was approximately 0.9 and the transmitted intensity at the edge of the field of vision approximately 1/10 thereof. Thus FWHM is approximately the same for the DOE as for refractive lenses in the form of microspheres, while the intensity drops off more quickly towards the edge of the field of vision for the DOE. However, it is an advantage that for a given diameter the DOE offers the possibility of a relatively free choice of the f/number and the refraction index for the substrate, since both of these values will influence the diffraction-limiting FWHM. Another advantage of DOEs is that they have negligible field curvature, with the result that focus on the optical axis and focus at the edge of the field are approximately on the same plane. An analysis of the diffraction-limiting focusing characteristics for a DOE in contact with a planar substrate shows that for a DOE with a fixed diameter FWHM is inversely proportional to the substrate's refraction index and proportional to the f/number of the DOE in the substrate.

Finally it should be mentioned that diffractive optical elements DOEs have a large dispersion, the focal length of a DOE being highly dependent on the wavelength of the light.

Figure 6:
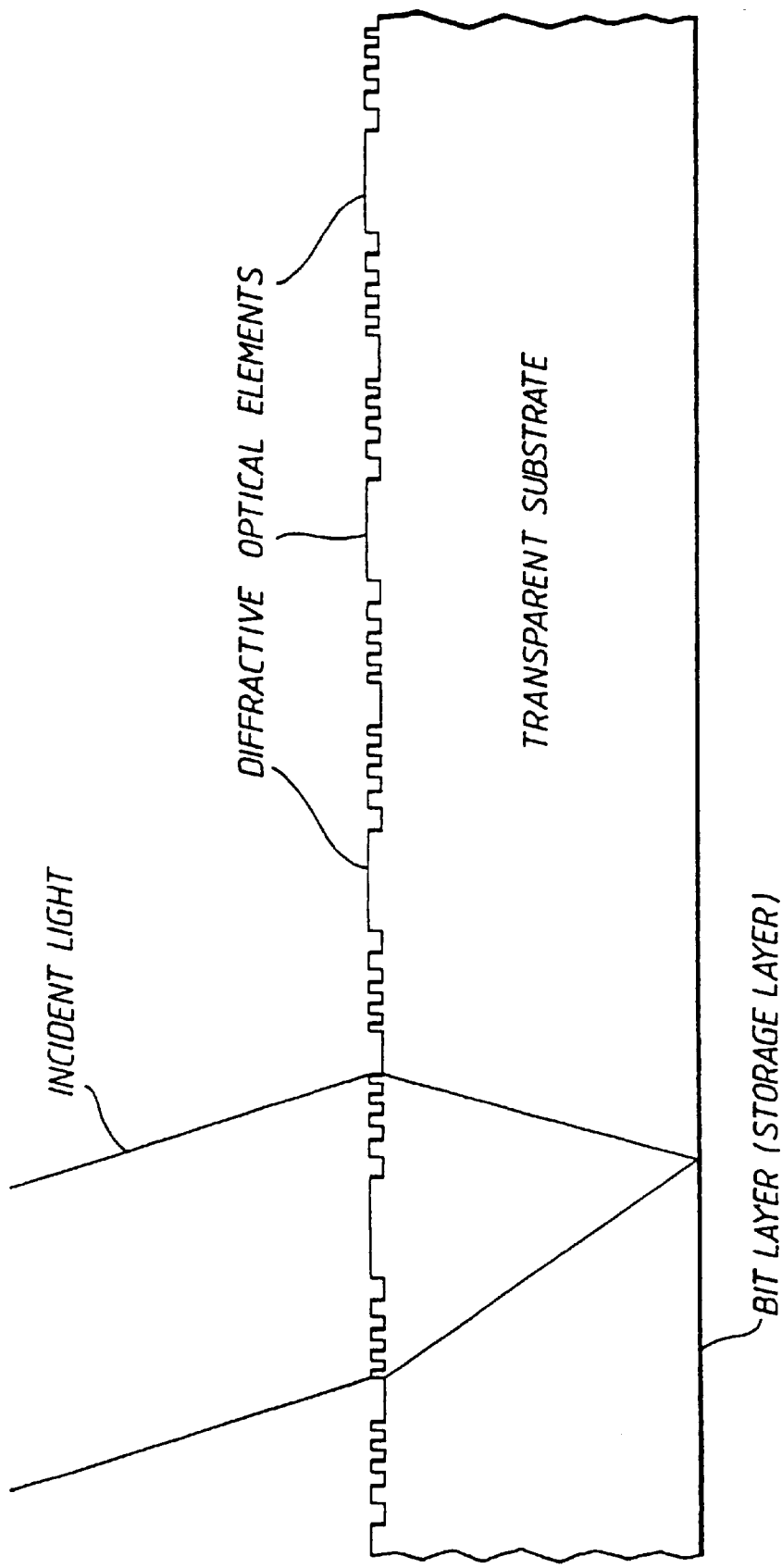
FIG. 6 is a schematic section through an optical data storage medium according to the present invention.

The design of a data carrying medium according to the present invention which employs diffractive optical elements DOEs or zone-plate lenses designed as described above will now be considered in more detail in connection with FIG. 6 which schematically illustrates a part of the data medium, with a dense matrix of diffractive optical elements DOEs on the surface of the data medium. Each DOE acts as a small lens and incident light is focused as mentioned above and directed towards a storage area, i.e. the information-bearing area which for the sake of brevity will be described as the bit layer in the following. Each bit of information is represented by how the material in the bit layer affects or is affected by light which strikes it during the illumination phase for the data. Assuming, e.g., that the data carrying medium is as illustrated in FIG. 6, light which is incident on the DOE at the front is focused at the rear of the DOE which is coated by a thin film of a tellurium alloy. The latter constitutes the bit layer or the storage layer and has low light transmission except in spots where it has been exposed to a short, high-intensity light pulse during the writing phase. The information content in this part of the data carrying medium which is associated with each diffractive optical element DOE is therefore represented by a set of light-transmitting or non-transmitting bit-allocated areas or structures in the bit layer which will, e.g., appear as bright or dark when they are read in transmission. Each data position in the data carrying medium is associated with a unique address which can be accessed through the DOE during writing and reading in two independent steps. The position of a given DOE on the surface of the data carrying medium is defined by an x,y coordinate, e.g. the position of its chromatic centre in relation to a reference origin on the data carrying medium, and the position of a spot in the bit layer related to its associated diffractive element DOE is defined by the direction of incidence of the light which is focused on this point, for example defined in standard polar coordinates $\theta$, $\phi$. Thus the complete address would be x, y, $\theta$, $\phi$.

In order to achieve as high a data storage density as possible in the medium, the spots or the data carrying structures must be as small as possible, and they should be arranged as closely together as possible under each DOE. Furthermore the "dead zone" between groups of data carrying structures accessed through different, but neighbouring DOEs should be minimized. The latter requirement imposes a link between the position pattern of each data carrying structure under each DOE, and the shape and the relative positions of DOEs on the medium's surface. It should be noted that very small data carrying structures or spot sizes can be achieved with DOEs which are several orders of magnitude larger than the data carrying structures. Moreover a large range of sizes of DOE may give almost the same average size of the data carrying structure and hence the same average local data storage density in the bit layer.

In the latter case a large DOE should be connected to a large number of positions of data carrying structures, thus implying more densely spaced angular addressing positions $\theta$, $\phi$ for incident light during reading and writing. As will be discussed later for optimized media, increasing the size of the DOE involves a reduction in the precision of spatial addressing x, y for each DOE, and this has to be weighed up against higher precision in the angular coordinates $\theta$, $\phi$.

As an example it can be mentioned that a DOE which occupies and area of 2500 $\mu^2$ typically can be assigned 10 000 or more data carrying structures, as was illustrated in the above, has a diameter of 0.3–0.7 $\mu$ and is separated by angular addressing shifts in $\theta$ and $\phi$ down to 0.5–1.0°. If the linear dimensions of the DOE were reduced by a factor N, the angular separation between neighbouring data carrying structures must be increased by approximately the same factor, while the number of data carrying structures associated with each DOE is reduced by a factor of $N^s$.

In certain embodiments of data carrying media according to the invention writing and reading can take place by means of the interaction of light with a thin film, in close analogy with conventional optical storage media. Indeed, films developed for conventional media of the type "write once, read many times" (WORM) as well as for rewriteable media can be directly implemented in the data storage medium according to the present invention. The distinguishing feature between the present invention and the other known techniques resides in how the light is guided and focused on to the bit layer and the consequences resulting therefrom.

Writing

Figure 7:
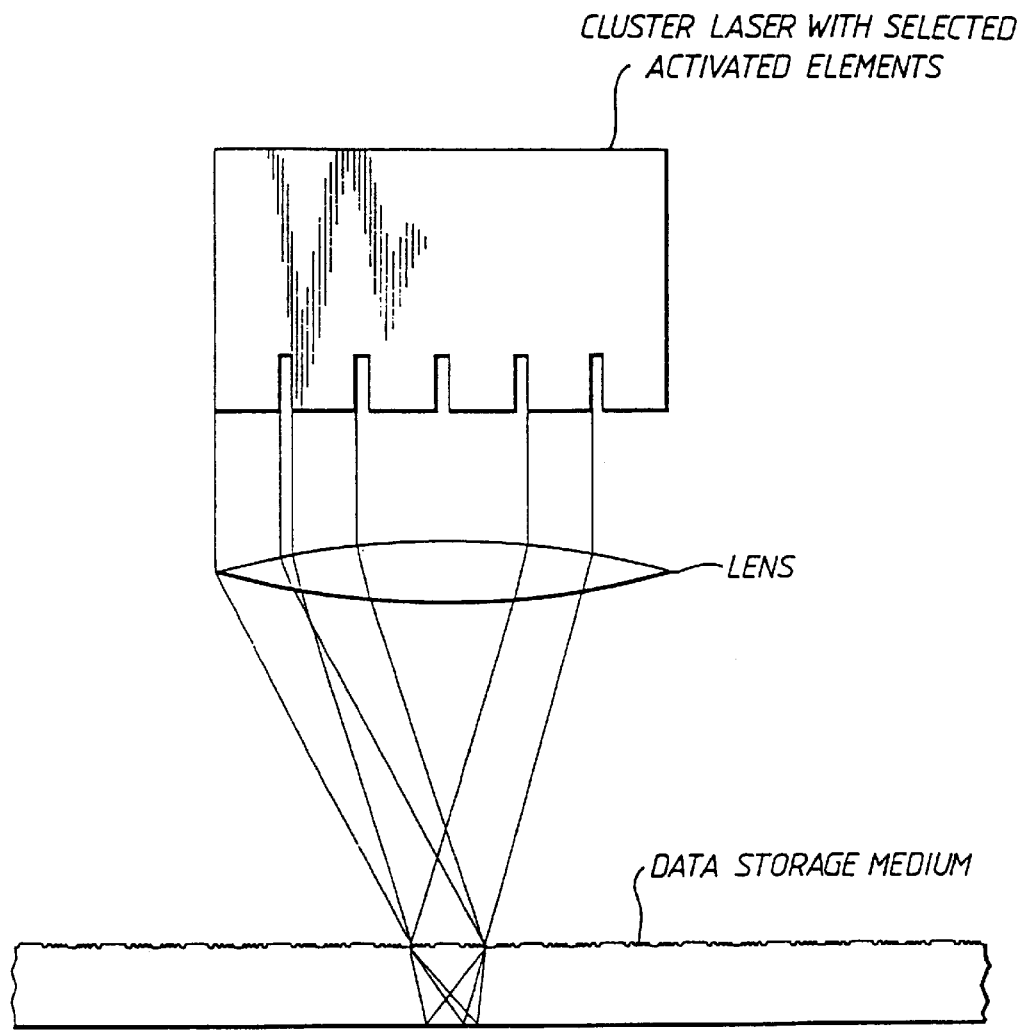
FIG. 7 is a schematic illustration of a method for parallel writing of data according to the present invention.

During writing a brief and intense light pulse is directed towards the designated DOE at the coordinate x, y in the designated direction θ, φ. In order to speed up the writing process, several or all directions associated with DOE are flashed simultaneously or in rapid sequence, e.g. by means of a flash-illuminated spatial light modulator (SLM) or a cluster laser (Vertical Cavity Surface Emitting Laser, VCSEL), as illustrated in FIG. 7. This effectively corresponds to parallel-track writing on a massive scale, as will be more closely described in the following. Alignment tolerances for the writing beams relative to each DOE depend on the explicit design and the performance parameters in each application, but are generally much wider than those which apply in traditional optical data storage schemes. In the latter case a tracking precision is required of under 1 μm in all three dimensions, while the positioning tolerance with a DOE may be one or two orders of magnitude more lax.

Reading

The physical layout of the data carrying medium, combined with hierarchical (x,y) (θ, φ) addressing qualitatively open up new opportunities for simple, high-speed random access and transfer of data. Instead of a sequential reading of a bit string along a track by means of a tightly focused laser beam, large scale parallel reading can be implemented by imaging large data blocks directly from the data carrying medium on to a matrix detector.

Figure 8:
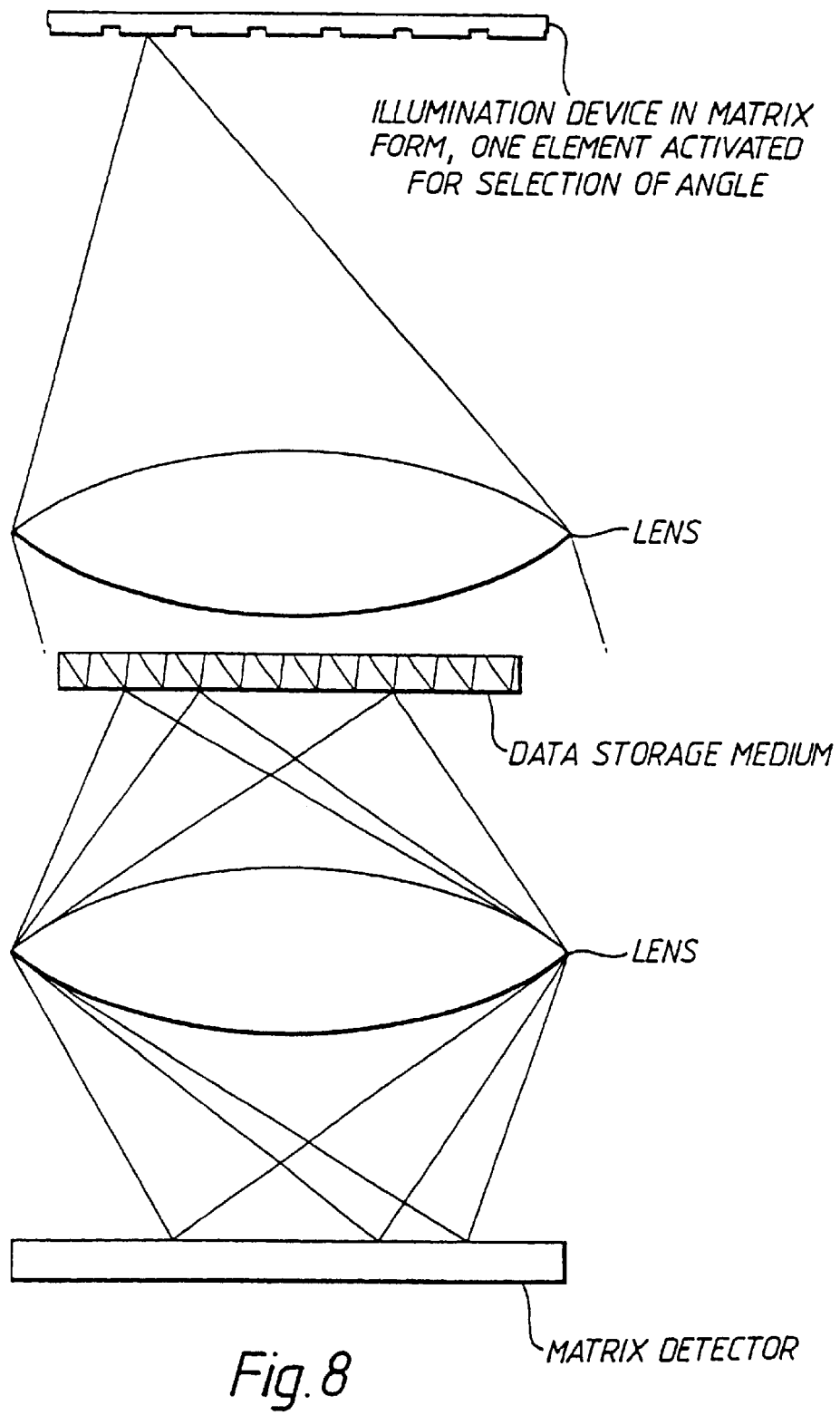
FIG. 8 is a schematic illustration of a method for parallel reading of data according to the present invention.

One embodiment of the invention is illustrated schematically in FIG. 8 where collimated light at an angle of incidence θ, φ is directed simultaneously at a large number of DOEs, causing the data carrying medium to display the θ, φ address bit status at each of the illuminated DOEs. The latter are typically spaced at relatively large intervals, 30–100 μm, on the surface of the data carrying medium and can therefore be easily resolved by wide field, long depth of field optics which image the θ, φ bit status at each DOE on to a matrix detector as illustrated. This is generally possible without a focusing servo, even with media which deviate considerably from planarity. The maximum depth of field for an optical system which resolves a 50 μm feature at an illumination wavelength of 480 nm is 10 mm. On the other hand, if bit status were to be assessed by direct imaging of the bit pattern in a simple planar layer without a DOE, a bit-to-bit spacing of less than 1 μm would entail a depth of field approximately equal to 3 μm and read-out on a large scale with simultaneous imaging on to a matrix detector would be impossible in practice, even with a focus servo. A method of circumventing this problem is provisionally described in U.S. Pat. No. 4,745,484 (J. Drexler & J. B. Arnold) which indicates a non-simultaneous imaging sequence in several distance steps.

The image formed on the matrix detector under illumination at $\theta_1$, $\phi_1$ containing bit status at all addresses (x, y, $\theta_1$, $\phi_1$) in the medium within the field of view, is transferred into the read device's electronic system for further processing, and the detector is cleared for a new read-out cycle, this time at read-out angle $\theta_2$, $\phi_2$. In turn, this yields the information content at all addresses (x, y, $\theta_2$, $\phi_2$) within the field of view. The cycle is repeated until all desired addresses in the data carrying medium have been read.

The above-described scheme of angle-multiplexed read-out from a planar medium is superficially similar to angle-multiplexed holographic memories and in certain respects similar to a scheme based on refractive or reflective structures that direct and focus light on to a burn film as described in International Published Patent Application no. WO91/11804 (P.-E. Nordal). As will be amplified in subsequent paragraphs, however, the use of DOEs according to the present invention provides technological opportunities and advantages with regard to performance and cost benefits which are not otherwise obtainable.

In connection with the account of the principle of DOEs in the above, it was demonstrated how small focal spots were achievable, given by the parameter FWHM. The size of the focal spots or FWHM when DOEs are used to focus in a bit layer or a storage layer are decisive for the achievable data density in this layer. Computations for relevant data medium designs and operative parameters such as light wavelength show that the spot size is diffraction-limited or near diffraction-limited across large portions of the area under each DOE. In specific terms this implies, e.g., that a correctly made DOE with a diameter of 50 μ illuminated at 450 nm wavelength can create a paraxial focal spot, i.e. on the optical axis with a diameter of 0.33 μm FWHM when the f/number is 1 and the refraction index in the substrate 1.6. At off-axis positions, i.e. with an angle of incidence θ>0°, the focal spots are influenced by aberration phenomena in the lens, and at θ=30° the focal spot has increased to 0.61 μm. As already mentioned, the curvature of the image field is very small, unless the DOE is built on a spherical surface in order to avoid coma. In that case the stated dispersive properties of the DOE can be exploited in order to remove field curvature.

As mentioned, a data carrying medium with diffractive optics provides flexibility and opportunities which have no analogy when using refractive or reflective optical systems. As already mentioned, this means that diffractive optics provide full freedom to select both the f/number and the refractive index of the substrate, and hence the size of the focal spots, in contrast to the case with spherical refractive lenses.

As mentioned, a striking aspect of diffractive optics is their very large dispersion, i.e. the focal length of the diffractive lens is highly dependent on the wavelength of the light. Thus while optical materials for refractive lenses exhibit an index of refraction change with wavelength which typically causes lens focal length to change by a relative value of 1% across the visible spectrum, the change is 40–50 times as large for diffractive lenses, corresponding to direct inverse proportionality between focal length and the wavelength of the light. This has obvious negative implications for applications where a stable, monochromatic light source is not available due to technical or cost restraints, or where it is desired to create images with polychromatic light In the present invention monochromatic light can be used and the wavelength tolerance of storage media with DOEs is compatible with relevant light sources such as semiconductor lasers and light emitting diodes LED. Thus by proper choice and variation of the wavelength it becomes possible to shift the focal point position inside the substrate in a controlled manner. In the present invention this can be exploited in several ways.

Correction for Image Field Curvature

Figure 9A:
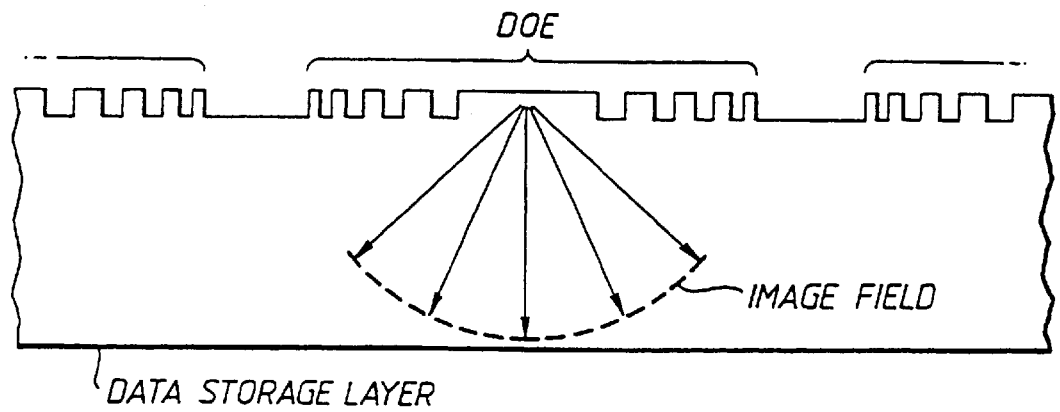
FIG. 9a,b is a schematic illustration of the principle of focusing laser beams on the same plane according to the present invention.
Figure 9B:
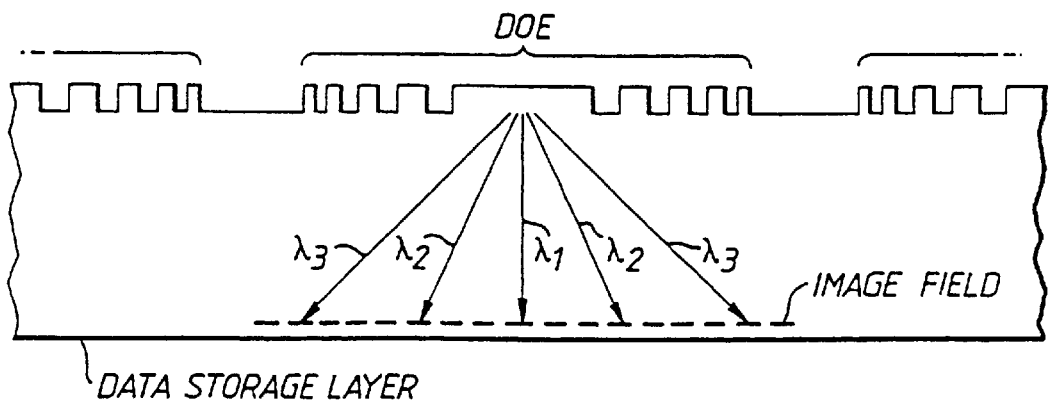

This is illustrated in FIG. 9a, where the bit layer is planar, but the image field in monochromatic light forms a spherical surface as indicated by the broken lines. Thus the focal spots created on the planar bit layer are formed and enlarged due to their position outside the optimal focal distance. Since the focal distance depends on the wavelength of the light, it should be noted that wavelength tuning of an incident monochromatic light beam as a function of incidence angle can be used to position the focus in the bit layer, e.g. as indicated in FIG. 9b. The basic principle may be implemented either by matrices of fixed-wavelength light sources, or with tunable light sources.

Simultaneous Accessing of Several Bit Layers by Means of Wavelength Tuning

Figure 10:
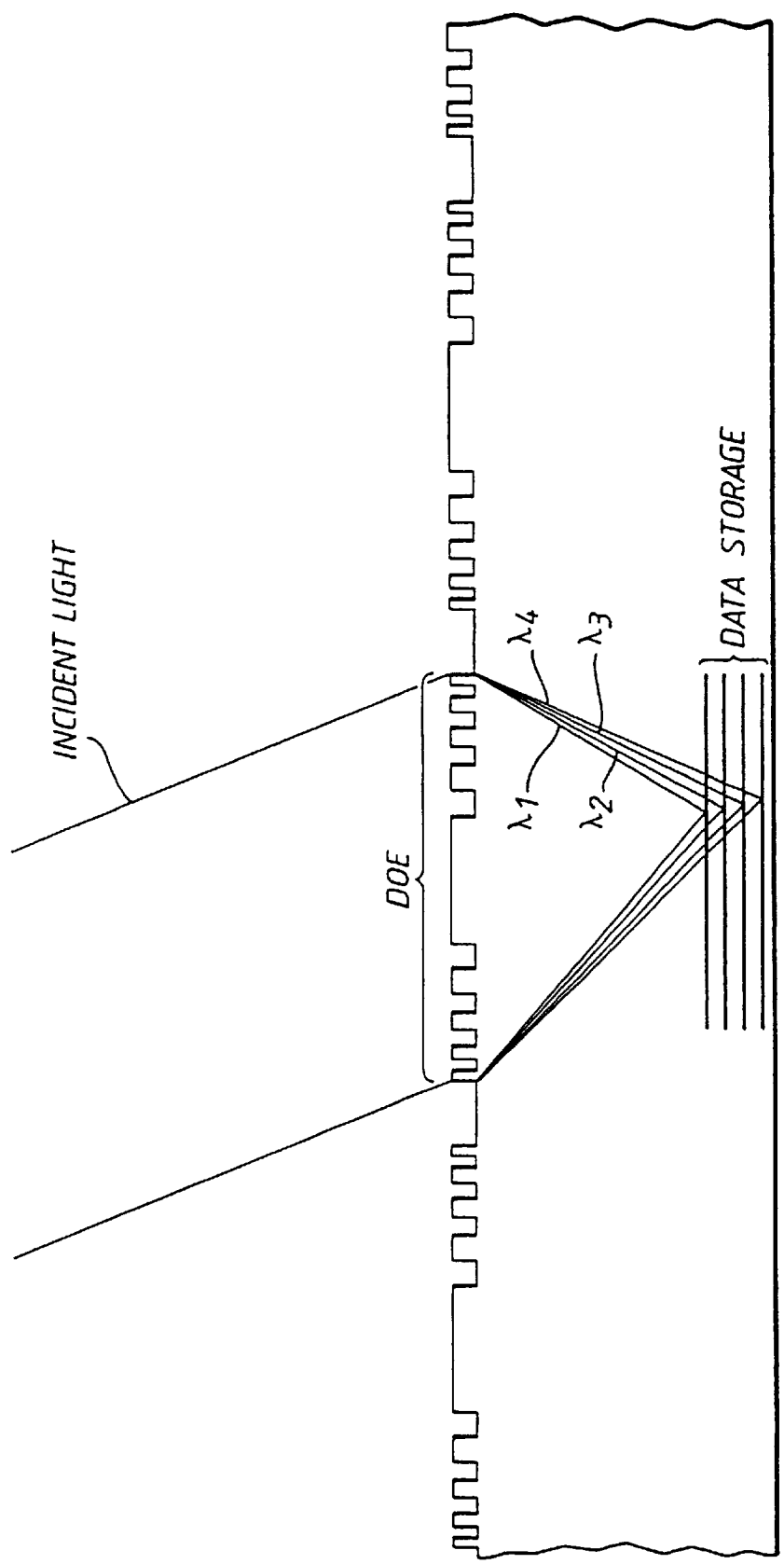
FIG. 10 is a schematic illustration of a method for parallel accessing of several storage layers in the data storage medium according to the present invention.

Since the focal distance can be tuned by adjusting the light wavelength, it becomes possible to form data carrying structures in layers at different depths as shown in FIG. 10. A basic factor making such a scheme practical is the large dispersion in the DOE. In order to avoid crosstalk between different layers, they must be separated by at least a distance s, cf. FIG. 10. The minimum acceptable value of the separation s depends on several factors such as the writing characteristics of the bit layer film, the required contrast and the acceptable crosstalk level. The latter depends in turn on whether the data content in each focus spot is enhanced by, e.g., greylevel coding. Thus, in designing for the highest possible ratio between data density and write/read capacity, there exists a trade-off between the code levels in a greylevel encoding on the one hand and simultaneous writing/reading of several bit layers on the other.

A simple assessment of the possibilities can be made by referring to FIG. 10, assuming that a focal spot of negligible size can be employed in one of the bit layers shown. Then the diameter $d_{fs}$ of the focal spot for the converging light which passes through an adjacent bit layer will be approximately $$d_{fs} = \frac{D \cdot s}{f} \quad (2)$$

where D is the diameter and f the focal length of the microlens. Since the focal length of diffractive optical elements DOEs is inversely proportional to the light wavelength $\lambda$, one has for a wavelength change of magnitude $$\frac{\Delta\lambda}{\lambda} = \frac{s}{f} \quad (3)$$

It may now be demanded that $d_{fs}$ should be so large that the light intensity in the bit layers which are out of focus is reduced by z certain factor in relation to that at optimum focus. Neglecting absorption in the bit layer and assuming that $d_{fs}$=2.0 µm, which gives a reduction in intensity by a factor of 16 if the minimum actual focal spot diameter is 0.5 µm, one finds with D=50 µm $$\frac{\Delta\lambda}{\lambda} = \frac{d_{fs}}{D} = \frac{2,0}{50} = 0,04 \quad (4)$$

This means that a wavelength change of 4% is required in this specific case, i.e. for example an increase from 480 nm wavelength to 500 nm wavelength. If the light is kept within the visible or near visible spectrum, a number of bit layers or storage layers can be used, each of which is addressed by illumination at its assigned wavelength,.e.g., assuming 4% separation between neighbouring wavelengths: 460 nm, 479 nm, 498 nm, 518 nm, 539 nm, 561 nm, 584 nm, 608 nm, 633 nm, 659 nm, 686 nm, 714 nm, 743 nm and 773 nm. In this example there are 14 layers, which gives a 14-fold increase in storage capacity compared to a single storage layer, provided data density in each layer is the same in both cases.

This multilayer storage concept resembles somewhat certain already known schemes for data storage in two or more parallel layers on discs, but with an important difference. In the present invention addressing of each layer takes place by wavelength tuning of the light, while the known schemes are all based on mechanical positioning of the write/read optics by means of a servo-controlled actuator. Thus, in the present invention mechanical complexity is avoided while at the same time wavelength tuning provides extremely fast random access.

A well-known problem with multilayer storage is that light must transverse intervening bit layers as it propagates into the medium to strike the relevant bit layer or storage layer. As light propagates from this layer towards the detector, the same intervening layers must be traversed again (with reading in reflection), or layers on the opposite side of the relevant storage layer have to be traversed (with reading in transmission). This problem has been dealt with previously by IBM, who concluded that 10 layers should be feasible in practical systems, by careful balancing of the reflectivity in each layer (reading of the data medium in reflection). It is reasonable to expect that the data medium read in transmission will generally be less demanding in this respect.

The optical storage medium according to the present invention can be so designed that ten storage layers of 2 µm thickness together form a sandwich structure or a stack of storage layers which extend 10 µm on each side of the central layer. A number of different structures can be implemented or generated within this volume.

(1) Each layer may be created by the writing beam generating data carrying structures, i.e. bit points which define bit layers inside an initially homogeneous block of 20 µm thickness, in which case each data carrying structure will actually be a small volume element corresponding to a high-intensity volume element in the focused write beam.

(2) Alternatively a sandwich structure of separate layers is built into the data storage medium during manufacture. Each layer may then be given a specific spectral response, for example by embedding dye molecules, which matches the wavelength of the light which comes into optimum focus in that particular storage layer. Thus, the response may be selective absorption in a narrow absorption band in the unwritten state of the storage layer, changing to low absorption in the written spot (bleaching). If the absorption bands are narrow and non-overlapping, all other layers except the relevant one will appear transparent to the light at this wavelength, thus removing contrast and crosstalk problems.

With regard to the diffractive optical elements used, these are currently available from several producers and are supplied with the quality and dimensions necessary for the present invention.

It will be seen from the above that the optical data storage medium according to the present invention with the use of diffractive optical elements permits a genuine volumetric storage and accessing of data in a storage area, where the data can be stored in randomly chosen, but uniquely addressable positions in a volume of the storage area or also be arranged in specific storage layers in the storage area. In both cases, accessing of the stored data can also be performed randomly and volumetrically.

We claim:

1. An optical data storage medium comprising a data storage area formed by a substantially transparent homogeneous base material and with a number of optically active structures in the form of diffractive optical elements (DOE) adjacent to one side of the data storage area, wherein the diffractive optical elements (DOE) each are adapted to focus a light beam incident on the data storage area onto one or more points which each corresponds to a uniquely adressable location of a data-carrying structure which is to be generated or a generated data-carrying structure in the data storage area and/or to focus a redirected light beam or emitted light radiation from this point or these points onto a point outside the optical storage medium, wherein that the diffractive optical elements (DOE) are formed with controlled, stepwise phase changes.

2. An optical data storage medium according to claim 1, wherein the diffractive optical elements (DOE) are zone plate lenses.

3. An optical data storage medium according to claim 1, wherein the data storage area is provided between a transparent surface layer and a transparent substrate.

4. An optical data storage medium according to claim 3, wherein diffractive optical elements (DOE) are provided on the surface layer.

5. An optical data storage medium according to claim 3, wherein diffractive optical elements (DOE) are embedded in the surface layer.

6. An optical data storage medium according to claim 3, wherein diffractive optical elements (DOE) are formed integral with the surface layer.

7. An optical data storage medium according to claim 3, wherein between the surface layer and the data storage area there is provided an opaque layer, said opaque layer being destructible through absorption of radiant energy.

8. An optical data storage medium according to claim 1, wherein the storage medium is designed in the form of a tape, a disk or a card, and that the diffractive optical elements (DOE) are arranged on the surface of said tape, disk or card.

9. An optical data storage medium according to claim 1, wherein diffractive optical elements (DOE) are arranged in rows and columns, the diffractive optical elements thus forming a two-dimensional array.

10. An optical data storage medium according to claim 1, wherein the data storage area comprises one or more storage layers which form one or more distinct storage planes, and that the storage layer comprises fluorescent dye molecules embedded in the base material which forms the storage layer, the dye molecules in each individual storage layer having a distinct spectral response matching the wavelength of the light beam focused onto this storage layer by the diffractive optical element (DOE).

11. An optical data storage medium according to claim 10, wherein one or more of the storage layers are partially reflecting or transmitting layers.

12. An optical data storage medium according to claim 10, wherein the storage layers are wavelength-dependent reflecting or transmitting layers.

13. A method for writing of data in an optical storage medium comprising a data storage area formed by a substantially transparent homogeneous base material and with a number of optically active structures in the form of diffractive optical elements (DOE) adjacent to one side of the data storage area, wherein the diffractive optical elements (DOE) each are adapted to focus a light beam incident on the data storage area onto one or more points which each corresponds to a uniquely adressable location of a data-carrying structure which is to be generated or a generated data-carrying structure in the data storage area and/or to focus a redirected light beam or emitted light radiation from this point or these points onto a point outside the optical storage medium, said method comprising forming the diffractive optical elements with controlled, stepwise phase changes, directing a laser beam onto a diffractive optical element on the optical storage medium, thus focusing said laser beam by said diffractive optical element onto a specific point in the data storage area, whereby the energy given off from said laser beam in the focal point effects a physical or chemical change in the material in a virgin data storage area at this point, and thereby generating a data carrying structure which is assigned a datum whose value corresponds to the degree of physical or chemical change in the material in said data carrying structure, said degree being determined by modulating said laser beam according to a predetermined modulation procedure.

14. A method for writing of data in an optical data storage medium comprising a data storage area formed by a substantially transparent homogeneous base material and with a number of optically active structures in the form of diffractive optical elements (DOE) adjacent to one side of the data storage area, wherein the diffractive optical elements (DOE) each are adapted to focus a light beam incident on the data storage area onto one or more points which each corresponds to a uniquely adressable location of a data-carrying structure which is to be generated or a generated data-carrying structure in the data storage area and/or to focus a redirected light beam or emitted light radiation from this point or these points onto a point outside the optical storage medium, and wherein a wavelength-tunable laser is employed in the method, said method comprising forming the diffractive optical elements with controlled, stepwise phase changes, directing a laser beam on to a diffractive optical element on the optical storage medium, tuning said laser beam's wavelength such that said laser beam is focused by said diffractive optical element onto a specific point in the data storage area, and whereby the energy given off by said laser beam in the focal point effects a physical or chemical change in the material in a virgin data storage area at this point, and thereby generating a data carrying structure which is assigned a datum whose value corresponds to the degree of physical or chemical change in the material in said data carrying structure, said degree being determined by modulating said laser beam according to a predetermined modulation procedure.

15. A method for reading of data in an optical data storage medium comprising a data storage area formed by substantially transparent homogeneous base material and with a number of optically active structures in the form of diffractive optical elements (DOE) adjacent to one side of the data storage area, wherein the diffractive optical elements (DOE) each are adapted to focus a light beam incident on the data storage area onto one or more points which each corresponds to a uniquely addressable location of a data-carrying structure which is to be generated or a generated data-carrying structure in the data storage area and/or to focus a redirected light beam or emitted light radiation from this point or these points onto a point outside the optical storage medium, wherein data has been written to the data carrying structures by forming the diffractive optical elements with controlled, stepwise phase changes, directing a laser beam onto a diffractive optical element on the optical storage medium, thus focusing said laser beam by said diffractive optical element onto a specific point in the data storage area, whereby the energy given off from said laser beam in the focal point effects a physical or chemical change in the material in a virgin data storage area at this point, and thereby generating a data carrying structure which is assigned a datum whose value corresponds to the degree of physical or chemical change in the material in said data carrying structure, said degree being determined by modulating said laser beam according to a predetermined modulation procedure, said method comprising directing a light beam onto said diffractive optical element on the optical data storage medium, thus focusing said light beam onto a specific data carrying structure in the data storage area, whereby the energy given off from said light beam in the focal point effects an optically detectable response from said data carrying structure, wherein said detectable response corresponds to the value of the datum stored in said data carrying structure, and focusing said optically detectable response by said diffractive optical element onto an optical detector provided outside said optical storage medium for detecting said data.

16. A method according to claim 15, wherein the data storage medium comprises storage layers with fluorescent dye molecules embedded in the base material which forms the storage layers, and for read-out of data light is employed with a wavelength tuned to the spectral response of the fluorescent dye molecules provided in each individual storage layer.

17. A method for reading of data in an optical data storage medium comprising a data storage area formed by a substantially transparent homogeneous base material and with a number of optically active structures in the form of diffractive optical elements (DOE) adjacent to one side of the data storage area, wherein the diffractive optical elements (DOE) each are adapted to focus a light beam incident on the data storage area onto one or more points which each corresponds to a uniquely addressable location of a data-carrying structure which is to be generated or a generated data-carrying structure in the data storage area and/or to focus a redirected light beam or emitted light radiation from this point or these points onto a point outside the optical storage medium, wherein the storage medium comprises data carrying structures with data written by forming the diffractive optical elements with controlled, stepwise phase changes, directing a laser beam on to a diffractive optical element on the optical storage medium, tuning said laser beam's wavelength such that said laser beam is focused by said diffractive optical element onto a specific point in the data storage area, and whereby the energy given off by said laser beam in the focal point effects a physical or chemical change in the material in a virgin data storage area at this point, and thereby generating a data carrying structure which is assigned a datum whose value corresponds to the degree of physical or chemical change in the material in said data carrying structure, said degree being determined by modulating said laser beam according to a predetermined modulation procedure, said method comprising directing a light beam onto said diffractive optical element on the optical data storage medium, tuning said light beam's wavelength such that said light beam is focused onto a specific data carrying structure in the data storage area, whereby the energy given off from said light beam in the focal point effects an optically detectable response from said data carrying structure, wherein said detectable response corresponds to the value of the datum stored in said data carrying structure, and focusing said optically detectable response through said diffractive optical element on to an optical detector provided outside said optical storage medium for detecting said data.

18. A method according to claim 17, wherein the data storage medium comprises storage layers with fluorescent dye molecules embedded in the base material which forms the storage layers, and for read-out of data light is employed with a wavelength tuned to the spectral response of the fluorescent dye molecules provided in each individual storage layer.

19. A method for reading of data in an optical data storage medium comprising a data storage area formed by a substantially transparent homogeneous base material and with a number of optically active structures in the form of diffractive optical elements (DOE) adjacent to one side of the data storage area, wherein the diffractive optical elements (DOE) each are adapted to focus a light beam incident on the data storage area onto one or more points which each corresponds to a uniquely addressable location of a data-carrying structure which is to be generated or a generated data-carrying structure in the data storage area and/or to focus a redirected light beam or emitted light radiation from this point or these points onto a point outside the optical storage medium, wherein the storage medium comprises data carrying structures with data written by forming the diffractive optical elements with controlled, stepwise phase changes, directing a laser beam on to a diffractive optical element on the optical storage medium, tuning said laser beam's wavelength such that said laser beam is focused by said diffractive optical element onto a specific point in the data storage area, and whereby the energy given off by said laser beam in the focal point effects a physical or chemical change in the material in a virgin data storage area at this point, and thereby generating a data carrying structure which is assigned a datum whose value corresponds to the degree of physical or chemical change in the material in said data carrying structure, said degree being determined by modulating said laser beam according to a predetermined modulation procedure, tuning the laser beam's wavelength such that said laser beam is focused onto a point in a specific storage layer where it generates the data carrying structure, said method comprising directing a light beam onto said diffractive optical element on the optical data storage medium, tuning said light beam's wavelength such that said light beam is focused onto a specific data carrying structure in the data storage area, whereby the energy given off from said light beam in the focal point effects an optically detectable response from said data carrying structure, wherein said detectable response corresponds to the value of the datum stored in said data carrying structure, and focusing said optically detectable response through said diffractive optical element on to an optical detector provided outside said optical storage medium for detecting said data.

20. A method for parallel writing of data in an optical storage medium, comprising a data storage area formed by a substantially transparent homogeneous base material and with a number of optically active structures in the form of diffractive optical elements (DOE) adjacent to one side of the data storage area, wherein the diffractive optical elements (DOE) each are adapted to focus a light beam incident on the data storage area onto one or more points which each corresponds to a uniquely adressable location of a data-carrying structure which is to be generated or a generated data-carrying structure in the data storage area and/or to focus a redirected light beam or emitted light radiation from this point or these points onto a point outside the optical storage medium, said method comprising forming the diffractive optical elements with controlled, stepwise phase changes, directing two or more laser beams emitted by a laser device which comprises two or more separately activatable laser elements, through an optical device and with different angles of incidence onto a diffractive optical element on the optical storage medium, tuning each individual laser beam's wavelength such that said laser beam is focused by said diffractive optical element onto the same plane, said plane corresponding to a specific storage layer in the data storage area, whereby the energy given off from each laser beam in the focal point effects a physical or chemical change in the material in a virgin storage layer in each focal point in said plane, thereby generating a number of data carrying structures in said plane corresponding to the number of laser beams, and assigning to each data carrying structure a datum whose value corresponds to the degree of physical and chemical change in said data carrying structure, said degree being determined by modulating said respective laser beam according to a predetermined modulation procedure.

21. A method for parallel reading of data in an optical storage medium comprising a data storage area formed by a substantially transparent homogeneous base material and with a number of optically active structures in the form of diffractive optical elements (DOE) adjacent to one side of the data storage area, wherein the diffractive optical elements (DOE)are formed with controlled stepwise phase changes and each are adapted to focus a light beam incident on the data storage area onto one or more points which each corresponds to a uniquely adressable location of a data-carrying structure which is to be generated or a generated data-carrying structure in the data storage area and/or to focus a redirected light beam or emitted light radiation from this point or these points onto a point outside the optical storage medium, said method comprising directing two or more light beams from an illumination device which comprises two or more selectively activatable light sources with fixed or tunable wavelengths, said light beams' wavelengths either being fixed or tuned by an optical device, onto one or more diffractive optical elements on the data storage medium, thus focusing said light beams onto specific data carrying structures in the data storage area, whereby the energy given off from each light beam in the respective focal point manner effects optically detectable responses from said data carrying structures, and focusing said optically detectable responses through a further optical device on the opposite side of said data storage medium and onto optical detector elements in an optical detector device, the detected optical responses corresponding to the values of the data assigned to said respective data carrying structures.

22. A method according to claim 21, wherein a plurality of light sources are employed in the illumination device to direct a number of light beams corresponding to the employed light sources through the optical device, and focusing the individual light beams through one or more diffractive optical elements at different angles of incidence, for parallel generation of an optically detectable response from a number of data carrying structures assigned to one and the same diffractive element.

23. A method according to claim 22, wherein the light sources are arranged in the illumination device such that they form a matrix.

24. A method according to claim 22, wherein tuning the individual light beams are simultaneously tuned from the illumination device to different wavelengths for parallel generation of an optically detectable response from a number of data carrying structures which are located in different planes or storage layers in the optical storage area, with the result that in addition to a parallel read-out of data stored in data carrying structures in the same plane or storage layer, a parallel read-out is also obtained of data stored in data carrying structures on different planes or storage layers.

25. A method according to claim 21, wherein optical filters are employed for the read-out of data.

26. A method for reading of data in an optical data storage medium comprising a data storage area formed by a substantially transparent homogeneous base material and with a number of optically active structures in the form of diffractive optical elements (DOE) adjacent to one side of the data storage area, wherein the diffractive optical elements (DOE) each are adapted to focus a light beam incident on the data storage area onto one or more points which each corresponds to a uniquely addressable location of a data-carrying structure which is to be generated or a generated data-carrying structure in the data storage area and/or to focus a redirected light beam or emitted light radiation from this point or these points onto a point outside the optical storage medium, wherein the storage medium comprises data carrying structures with data written by forming the diffractive optical elements with controlled, stepwise phase changes, directing a laser beam on to a diffractive optical element on the optical storage medium, tuning said laser beam's wavelength such that said laser beam is focused by said diffractive optical element onto a specific point in the data storage area, and whereby the energy given off by said laser beam in the focal point effects a physical or chemical change in the material in a virgin data storage area at this point, and thereby generating a data carrying structure which is assigned a datum whose value corresponds to the degree of physical or chemical change in the material in said data carrying structure, said degree being determined by modulating said laser beam according to a predetermined modulation procedure, tuning the laser beam's wavelength in such a manner that the degree of tuning defines one or more random storage layers in the homogenous base material, said method comprising directing a light beam onto said diffractive optical element on the optical data storage medium, tuning said light beam's wavelength such that said light beam is focused onto a specific data carrying structure in the data storage area, whereby the energy given off from said light beam in the focal point effects an optically detectable response from said data carrying structure, wherein said detectable response corresponds to the value of the datum stored in said data carrying structure, and focusing said optically detectable response through said diffractive optical element on to an optical detector provided outside said optical storage medium for detecting said data.

* * * * *